US006397363B1

(12) United States Patent
Maeno et al.

(10) Patent No.: US 6,397,363 B1
(45) Date of Patent: May 28, 2002

(54) SEMICONDUCTOR INTEGRATED CIRCUIT DEVICE WITH TEST CIRCUIT

(75) Inventors: Hideshi Maeno; Tokuya Osawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/435,622

(22) Filed: Nov. 8, 1999

(30) Foreign Application Priority Data

Jun. 11, 1999 (JP) ............................................ 11-165830

(51) Int. Cl.$^7$ ...................... G01R 31/28; G11C 29/00; G06F 11/00
(52) U.S. Cl. ...................... 714/726; 714/718; 714/819; 714/704
(58) Field of Search ................................ 714/718, 719, 714/819, 824, 726, 735, 736, 704; 365/200, 201

(56) References Cited

U.S. PATENT DOCUMENTS

| 5,233,610 A | * | 8/1993 | Nakayama et al. ......... 714/704 |
| 5,481,671 A | * | 1/1996 | Fujisaki ......................... 714/8 |
| 5,771,194 A | | 6/1998 | Maeno ....................... 365/200 |
| 5,815,512 A | | 9/1998 | Osawa et al. ............... 714/726 |
| 6,009,028 A | * | 12/1999 | Akiyama .................... 365/201 |

* cited by examiner

Primary Examiner—Christine T. Tu
(74) Attorney, Agent, or Firm—Burns, Doane, Swecker & Mathis, LLP

(57) ABSTRACT

A semiconductor integrated circuit device includes a memory circuit and a flag generator. The memory circuit is a circuit with a test circuit and includes a redundant circuit. The flag generator loads compared result information serially output from the memory circuit, and outputs flag signals if the compared result information includes at least one piece of mismatch information. This makes it possible to solve a problem of a conventional semiconductor integrated circuit device in that it takes a long time for carrying out a fault test of bits constituting the memory circuit.

8 Claims, 12 Drawing Sheets

US 6,397,363 B1

SEMICONDUCTOR INTEGRATED CIRCUIT DEVICE WITH TEST CIRCUIT

BACKGROUND OF THE INVENTION

1. Field of the Invention

The present invention relates to a semiconductor integrated circuit device including a test circuit and a redundant circuit for a memory circuit, and having a function to supply information about the presence or absence of a fault and about fault remediableness.

2. Description of Related Art

One of conventional semiconductor integrated circuit devices including a test circuit and a redundant circuit is disclosed in Japanese patent application laid-open No. 8-94718 (1996).

FIG. 10 is circuit diagram showing a scan flip-flop for RAM test in a conventional semiconductor integrated circuit device disclosed in the foregoing Japanese patent application laid-open No. 8-94718 (1996). In FIG. 10, the reference numeral 100 designates a scan flip-flop (SFF), 101 designates a comparator for comparing data output from a RAM including a plurality of memory cells with a preset expected value, and for outputting a compared result.

FIG. 11 is a circuit diagram showing a RAM with a test circuit in a conventional semiconductor integrated circuit device. In FIG. 11, the reference numeral 111 designates a RAM consisting of a plurality of memory cells. Outputs DO<> of the RAM 111 are connected to five scan flip-flops (SFFs) 100 connected in series. The five scan flip-flops (SFFs) 100 connected in series constitute a scan path circuit for testing the RAM 111.

FIG. 12 is a circuit diagram showing a conventional semiconductor integrated circuit device with a RAM 121 combined with a redundant circuit 122. The RAM 121 is a 5-bit RAM with a test circuit consisting of the RAM 111 and the five scan flip-flops (SFFs) 100 connected in series to constitute a scan path circuit as shown in FIG. 11. In FIG. 12, the reference numeral 123 designates a register for loading and storing the output data SO<i+1>–SO<i+4> from the scan flip-flops (SFFs) 100. The RAM 121 of the semiconductor integrated circuit device with a test circuit supplies the register 123 with 5-bit data output signals SO<i>, SO<i+1>, SO<i+2>, SO<i+3> and SO<i+4>.

Next, the operation of the conventional device will be described.

First, a test operation will be described for the RAM 111 with five scan flip-flops (SFFS) 100 constituting the scan path circuit as shown in FIG. 11.

Before carrying out the operation test of the RAM 111, which is a memory circuit including a plurality of memory cells, that is, a plurality of bits, a control signal TM and a control signal SM are set at TM=0 and SM=1, and data "1" is shifted in from the SIDO terminal of the first scan flip-flop (SFF) 100. For example, the five bit scan path circuit as shown in FIG. 11 requires five clock pulses. As a result, the outputs of the scan flip-flops (SFFs) 100 are placed at SO<i>=1, SO<i+1>=1, SO<i+2>=1, SO<i+3>=1 and SO<i+4>=1.

Subsequently, a test of the entire addresses of the RAM 111 is performed with placing the control signals at TM=1 and SM=1. During writing and reading of the test data to and from the RAM 111, expected values EXP and a comparison control signal CMP (compare when "1") are controlled.

If a fault takes place in the RAM 111 while the comparison control signal CMP=1, the output DO<> of the RAM 111 associated with the fault will differ from its expected value EXP, and hence the output signal from the comparator 101 will be "0". Thus, the output SO of the scan flip-flop (SFF) becomes "0" in synchronism with a clock signal T. For example, if a fault occurs in the bit DO<i+2> of the RAM 111, the fault is detected at the scan flip-flop (SFF) <i+2> 100 corresponding to the bit, and the output SO<i+2> of the scan flip-flop (SFF) <i+2> 100 becomes "0". In this case, the remaining scan flip-flops (SFFs) 100 maintain their outputs at "1", and produces them as the outputs SO<i>, SO<i+1>, SO<i+3> and SO<i+4>.

After that, while the control signals are placed at TM=0 and SM=1, the test result is shifted out from the terminal SODO<i> of the final scan flip-flop (SFF) 100.

Next, the operation will be described of the RAM 121 with a test circuit including a redundant circuit 122. The semiconductor integrated circuit device as shown in FIG. 12 includes the redundant circuit 122 in connection with the RAM 121 with the test circuit as shown in FIG. 11. For example, if a bit fault is detected at the scan flip-flop (SFF) <i+2> 100 corresponding to the output DO<i+2> of the RAM 121, the output SO<i+2> of that scan flip-flop (SFF) 100 becomes "0". In this case, the remaining scan flip-flops (SFFs) 100 produce "1" as their outputs SO<i>, SO<i+1>, SO<i+3> and SO<i+4>.

Loading the outputs SO<i+1>–SO<i+4> from the scan flip-flops (SFFs) 100, the register 123 produces "1", "0", "1" and "1" as its outputs G<i+1>–G<i+4>, respectively. Thus, the outputs of logic gates 1221, 1222 and 1223 in the redundant circuit 122 will be F<i+3>=1, F<i+2>=0 and F<i+1>=0, respectively.

As a result, the output value DO<i+4>/Q<i+4> of the RAM 121 becomes the output value XDO<i+3> of the redundant circuit 122. Likewise, DO<i+3>/Q<i+3> becomes XDO<i+2>, DO<i+1>/Q<i+1> becomes XDO<i+1> and DO<i>/Q<i> becomes XDO<i>, thus eliminating the output value DO<i+2> corresponding to the fault bit.

In much the same fashion, the input value XDI<i+3> to the redundant circuit 122 becomes the input value DI<i+4> to the RAM 121. Likewise, XDI<i+2> becomes DI<i+3>, XDI<i+1> becomes DI<i+2> and DI<i+1>, and XDI<i> becomes DI<i>.

As a result, even if a bit error takes place in the memory cell corresponding to the output DO<i+2>, for example, the RAM 121 functions as a 4-bit input/output RAM because of a connecting/switching operation in the redundant circuit 122. However, if a two or more bit fault takes place in the data outputs DO<> of the RAM 121, a fault remedial processing using the foregoing redundant circuit 122 cannot be applied.

With such an arrangement, the foregoing conventional semiconductor integrated circuit device has a problem of taking a long time for carrying out the fault test of a plurality of memory cells constituting the semiconductor integrated circuit device. This is because to achieve the fault remedial processing, it is necessary to decide as to whether two or more pieces of fault information (value "0" in the foregoing example) are present in the test result shifted out from the SODO<i>, and this requires an external test device such as an LSI tester (not shown in the drawings) for making the decision.

SUMMARY OF THE INVENTION

The present invention is implemented to solve the foregoing problem. It is therefore an object of the present invention to provide a semiconductor integrated circuit device capable of reducing the time required for the test for the presence or absence of a fault of memory cells and for the fault remediableness. This is implemented by making a comparison and decision within the semiconductor integrated circuit device as to whether any fault information is present or not in the plurality of memory cells in the semiconductor integrated circuit device, and by outputting comparison and decision result to facilitate a fault decision processing and fault remedial processing by an external test instrument like an LSI tester.

According to a first aspect of the present invention, there is provided a semiconductor integrated circuit device comprising: at least one memory circuit that includes a plurality of memory cells for storing data, a redundant circuit provided for the plurality of memory cells, and a scan path circuit for comparing output data of the plurality of memory cells with a set of predetermined expected values and for outputting compared result information by serially shifting out compared results; and at least one first detector for loading the compared result information serially output from the scan path circuit of the memory circuit, for detecting whether at least one piece of mismatch information is included in the compared result information, and for outputting a detection result.

Here, the semiconductor integrated circuit device may further comprise at least one second detector for loading the compared result information serially output from the scan path circuit, for detecting whether at least two pieces of mismatch information is present in the compared result information, and for outputting a detection result.

The at least one memory circuit may include a plurality of memory circuits, the at least one first detector may include a plurality of first detectors, and the at least one second detector may include a plurality of second detectors, wherein the semiconductor integrated circuit device may further comprise a first scan path circuit for loading outputs of the plurality of first detectors and for shifting them out, and a second scan path circuit for loading outputs of the plurality of second detectors and for shifting them out.

The at least one memory circuit may include a plurality of memory circuits, the at least one first detector may, include a plurality of first detectors, and the at least one second detector may include a plurality of second detectors, wherein the semiconductor integrated circuit device may further comprise: a plurality of selectors, provided for the plurality of first detectors and the plurality of second detectors, for selecting one of a set of the outputs of the plurality of first detectors and a set of the outputs of the plurality of second detectors and for outputting the set selected; and a third scan path circuit for loading the set selected by the plurality of selectors, and for serially shifting it out.

The at least one memory circuit may be a mutliport memory circuit that has n data output ports that are accessible independently, where n is an integer greater than one, the redundant circuit may be provided for the mutliport memory cells in the mutliport memory circuit, and the scan path circuit may be provided for each of k data output ports of the n data output ports, where k is an integer greater than one and less than or equal to n, and i-th scan path circuit compares output data from i-th data output port with i-th set of predetermined expected values and serially shifts out a plurality of compared results, where i is an integer from one to k, wherein the semiconductor integrated circuit device may further comprise an AND circuit for ANDing the serial outputs from the scan path circuits, and wherein the at least one first detector may detect whether the output of the AND circuit includes at least one piece of mismatch information, and output a detection result.

The semiconductor integrated circuit device may further comprise a second detector for detecting whether at least two pieces of mismatch information is present in the output of the AND circuit, and for outputting a detection result.

According to a second aspect of the present invention, there is provided a semiconductor integrated circuit device comprising: a memory circuit that includes a plurality of memory cells for storing data, a redundant circuit provided for the plurality of memory cells, and a scan path circuit for comparing output data of the plurality of memory cells with a set of predetermined expected values and for outputting compared result information by serially shifting out compared results; and a counter circuit for loading the compared result information serially output from the scan path circuit, and for counting a number of pieces of mismatch information in the compared result information.

According to a third aspect of the present invention, there is provided a semiconductor integrated circuit device comprising a memory circuit including: a plurality of memory cells for storing data; a redundant circuit provided for the plurality of memory cells; a scan path circuit for comparing output data of the plurality of memory cells with a set of predetermined expected values and for outputting compared result information by serially shifting out compared results; and a selector for supplying the scan path circuit with the compared result information serially output from the scan path circuit.

DETAILED DESCRIPTION OF THE PREFERRED EMBODIMENTS

The invention will now be described with reference to the accompanying drawings.

Embodiment 1

Figure 1:
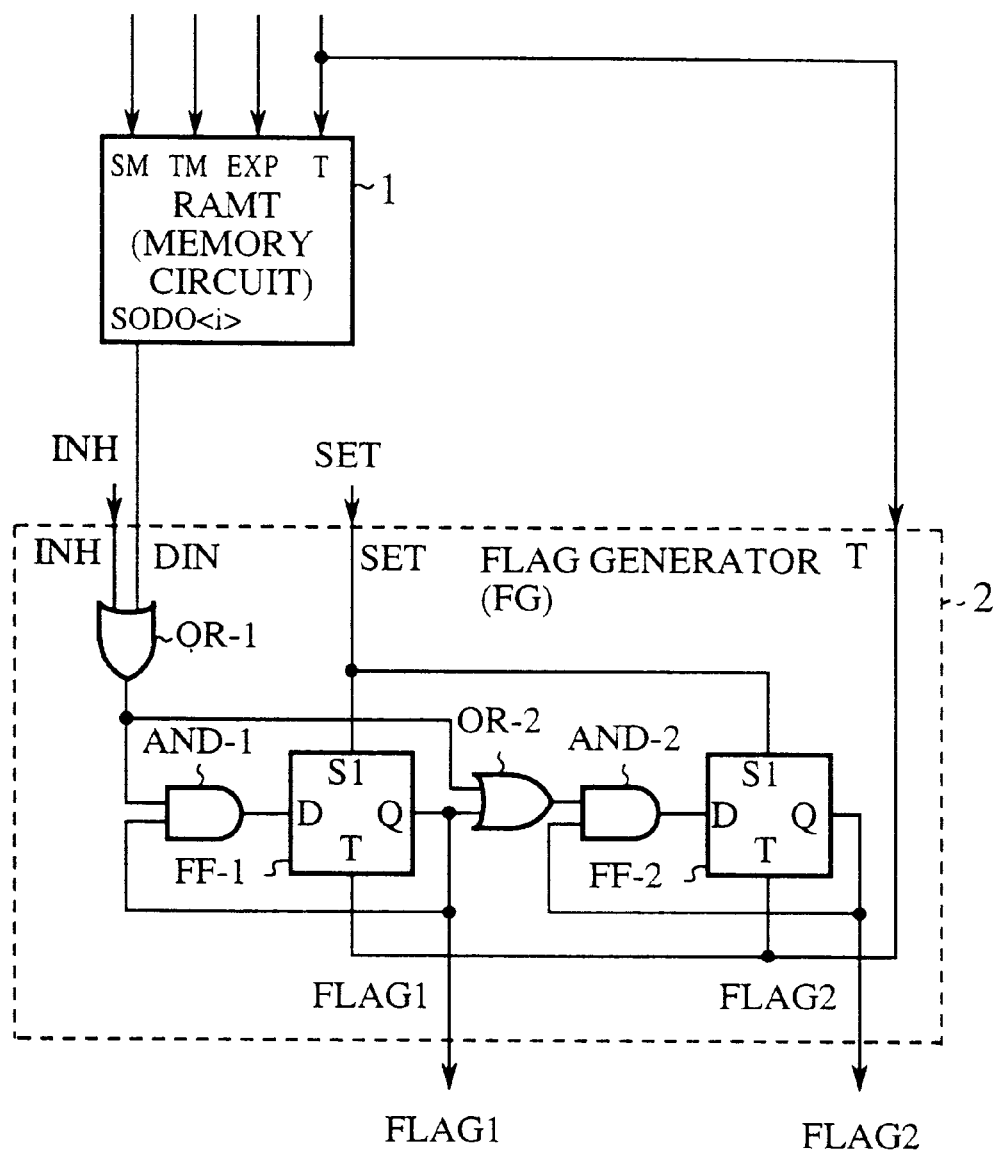
FIG. 1 is a circuit diagram showing an embodiment 1 of a semiconductor integrated circuit device in accordance with the present invention.
Figure 12:
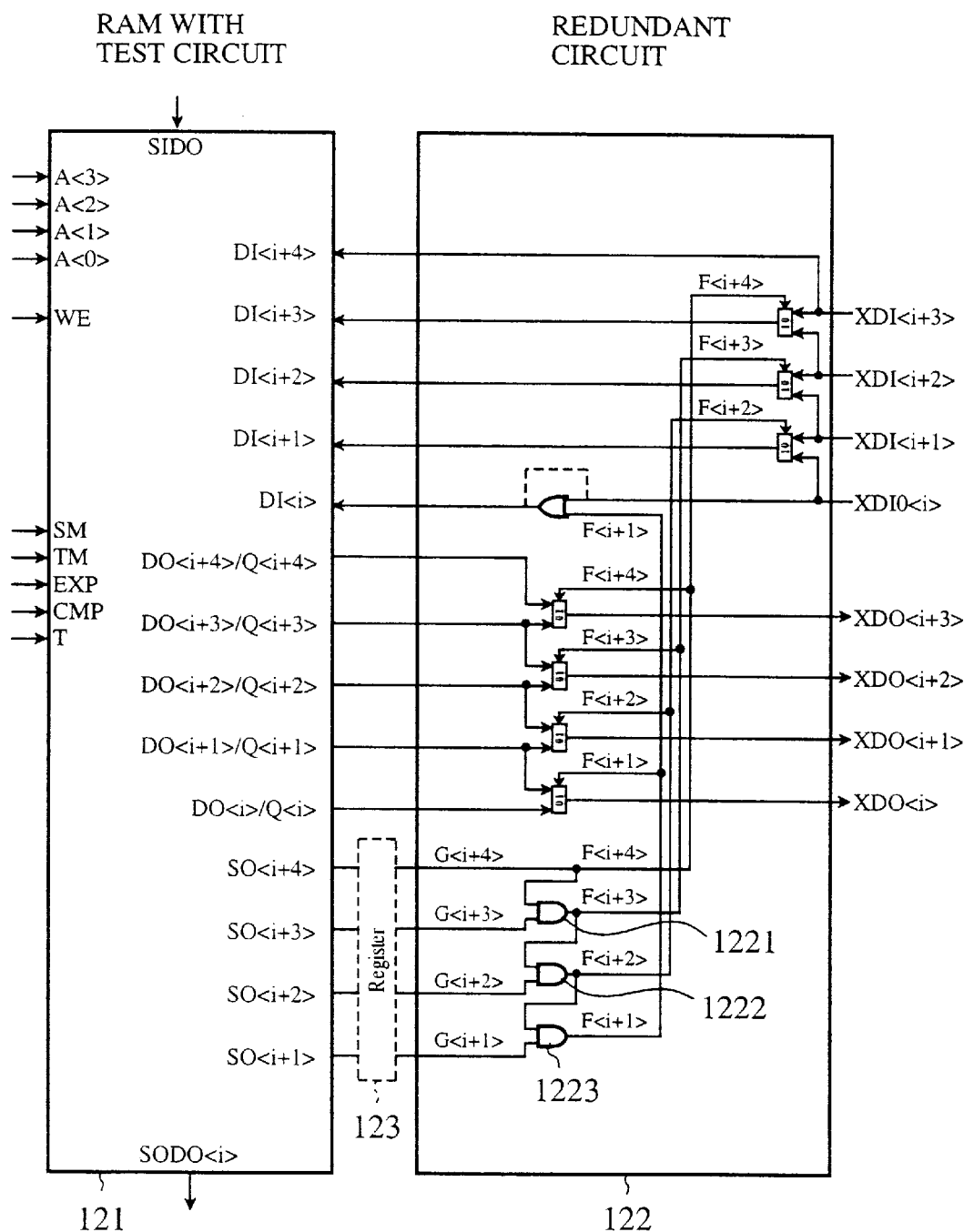
FIG. 12 is a circuit diagram showing a conventional semiconductor integrated circuit device including the RAM with a test circuit as shown in FIG. 11 and a redundant circuit connected with it.

FIG. 1 is a circuit diagram showing an embodiment 1 of a semiconductor integrated circuit device in accordance with the present invention. In FIG. 1, the reference numeral 1 designates a memory circuit with a test circuit incorporating a redundant circuit, or a RAMT (Random Access Memory with Test circuit), which corresponds to the semiconductor integrated circuit device as shown in FIG. 12, for example. The reference numeral 2 designates a flag generator that receives the output SODO<i> of the memory circuit (RAMT) 1, and makes a decision as to whether two or more pieces of fault information (value "0", for example) is present or not in the memory circuit (RAMT) 1. In the flag generator (FG) 2, FF-1 and FF-2 each designate a flip-flop.

Next, the operation of the present embodiment 1 will be described.

(1) First, a signal SET is supplied to set the values of the flip-flops FF-1 and FF-2 in the flag generator (FG) 2 to "1". This places the values of outputs FLAG1 and FLAG2 of the flip-flops FF-1 and FF-2 at "1".

(2) Subsequently, a control signal INH is set at "0" and is supplied to the flag generator (FG) 2. This places the decision operation in the flag generator (FG) 2 at ON state., In this state, with supplying clock pulses T to the flip-flops FF-1 and FF-2, test results in the memory circuit (RAMT) 1, which are shifted out from its outputs SODO<i>, are supplied to the flag generator (FG) 2.

(3) Subsequently, the control signal INH is set to "1" and supplied to the flag generator (FG) 2. This disables the decision operation in the flag generator (FG) 2.

In the foregoing operation (2), when the first fault information "0" is detected, the signal FLAG1 is placed to "0" and the signal FLAG2 to "1". Furthermore, when the second fault information "0" is detected, not only the signal FLAG1 but also the signal FLAG2 is placed to "0". In other words, the signal FLAG1 becomes "0" when one or more pieces of fault information "0" is detected, whereas the signal FLAG2 becomes "0" when two or more pieces of fault information is detected.

Thus, receiving the signal FLAG2 output from the flag generator (FG) 2, an external test instrument like an LSI tester (not shown in the drawings), for example, can make a quick and easy decision on the fault remediableness of the fault bit of the memory circuit (RAMT) 1. Likewise, the external test instrument like an LSI tester can make an easy decision about the presence or absence of a fault bit by making a decision of the FLAG1 output from the flag generator (FG) 2.

As described above, the present embodiment 1 incorporates the flag generator (FG) 2 in addition to the RAMT, which is the memory circuit 1 with the test circuit including the redundant circuit, thereby constructing the semiconductor integrated circuit device. This makes it possible for the external test instrument like an LSI tester to receive the signals FLAG1 and FLAG2 output from the flag generator (FG) 2, and to make a decision on the presence or absence of a fault and on the fault remediableness. This offers an advantage of being able to reduce the load of the external test instrument, and to achieve an easy and efficient fault decision operation such as deciding the presence or absence of a fault of the bits of the memory cells in the memory circuit RAMT1, or the fault remediableness.

Embodiment 2

Figure 2:
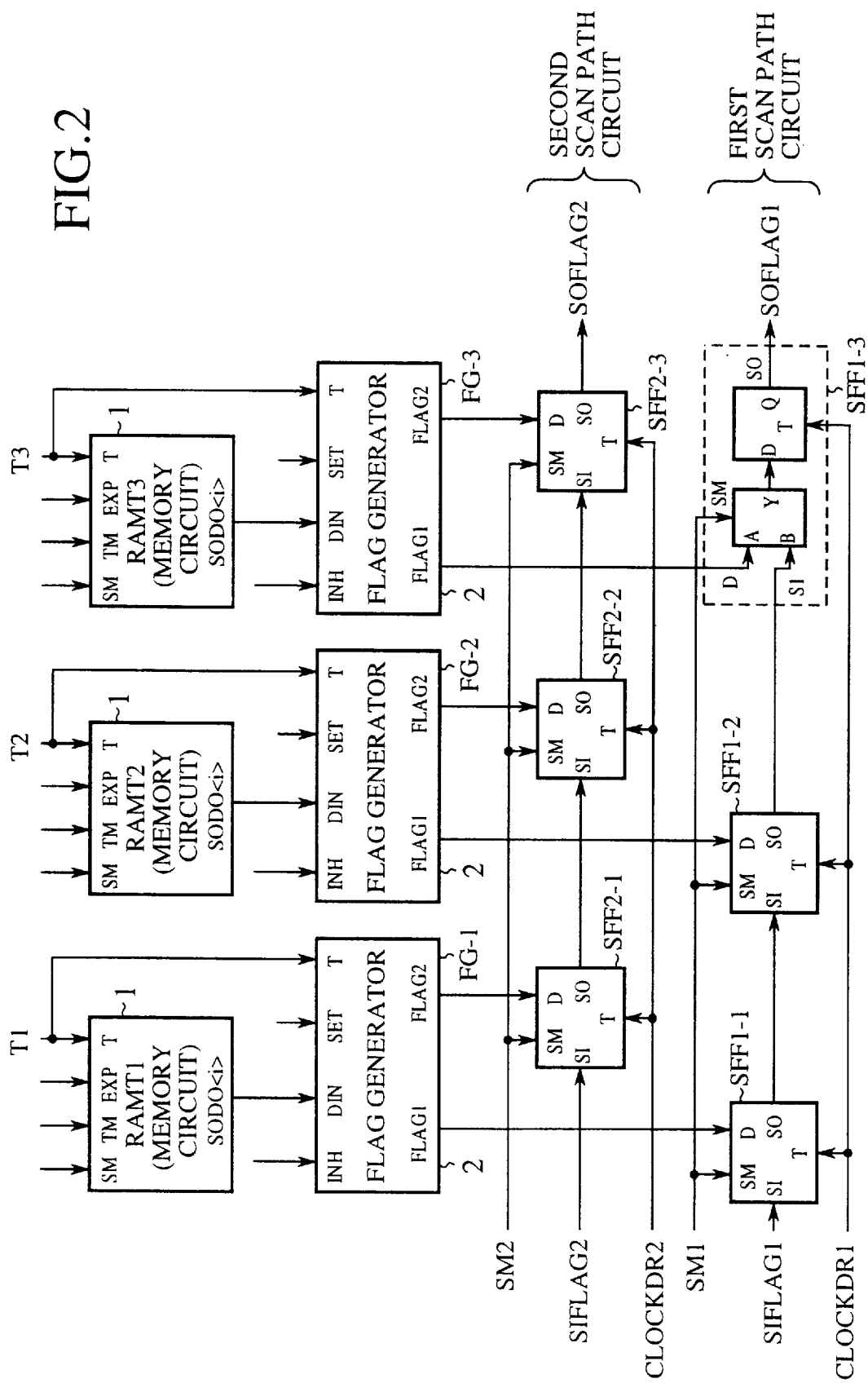
FIG. 2 is a circuit diagram showing an embodiment 2 of the semiconductor integrated circuit device in accordance with the present invention.

FIG. 2 is a circuit diagram showing an embodiment 2 of the semiconductor integrated circuit device in accordance with the present invention. In FIG. 2, RAMT1, RAMT2 and RAMT3 each designates a memory circuit with a test circuit including a redundant circuit, which corresponds to the memory circuit 1 (RAMT1) as shown in FIG. 1. Symbols FG-1, FG-2 and FG-3 each designate a flag generator that corresponds to the flag generator (FG) 2 as shown in FIG. 1. Symbols SFF1-1, SFF1-2 and SFF1-3 each designate a scan flip-flop that constitutes a first scan path circuit. Symbols SFF2-1, SFF2-2 and SFF2-3 also designate a scan flip-flop each, which constitutes a second scan path circuit.

Next, the operation of the present embodiment 2 will be described.

The fault decision operation will now be described of the semiconductor integrated circuit device incorporating the plurality of memory circuits RAMT1, RAMT2 and RAMT3 with test function. The present embodiment 2 of the semiconductor integrated circuit device comprises the first scan path circuit and the second scan path circuit. The first scan path circuit scans out the signals FLAG1 output from the flag generators 2, which are obtained from the output signals SODO<i> fed from the plurality of memory circuits RAMT1, RAMT2 and RAMT3. Likewise, the second scan path circuit scans out the signals FLAG2 output from the flag generators 2, which are obtained from the output signals SODO<i> fed from the plurality of memory circuits RAMT1, RAMT2 and RAMT3.

The present embodiment 2 of the semiconductor integrated circuit device as shown in FIG. 2 decides the fault remediableness as follows.

First, the scan flip-flops SFF1-1, SFF1-2 and SFF1-3 constituting the first scan path circuit load the signals FLAG1 output from the flag generators 2, that is, FG-1, FG-2 and FG-3. The operation of the flag generators (FG) 2 is the same as that of the foregoing embodiment 1.

Thus, if a one or more bit (memory cell) fault is detected in one of the plurality of memory circuits RAMT1, RAMT2 and RAMT3, the associated flag generator 2 outputs the signal FLAG1 of "0", and supplies it to the first scan path circuit. Then, receiving the signal SOFLAG1 output from the final scan flip-flop SFF1-3 in the first scan path circuit, an external test instrument like an LSI tester makes a decision about the presence or absence of a fault.

Likewise, if a two or more bit (memory cell) fault is detected in one of the plurality of memory circuits RAMT1, RAMT2 and RAMT3, the associated flag generator 2 outputs the signal FLAG2 of "0", and supplies it to the second scan path circuit. Then, receiving the signal SOFLAG2 output from the final scan flip-flop SFF2-3 in the second scan path circuit, the external test instrument like an LSI tester makes a decision about the fault remediableness.

If a fault is detected in two or more memory cells in any one of the plurality of memory circuit RAMT1, RAMT2 and RAMT3, and at least one of the signals FLAG2 becomes "0", a decision is made that the fault remediableness is impossible, and the semiconductor integrated circuit device incorporating the plurality of memory circuits is discarded in the manufacturing process.

As described above, according to the present embodiment 2 of the semiconductor integrated circuit device, which incorporates the plurality of memory circuits RAMT1, RAMT2 and RAMT3, the first scan path circuit and the second scan path circuit, can have the external test instrument like an LSI tester decide not only the presence or absence of a fault in the memory circuits using the signal SOFLAG1 output from the first scan path circuit, but also the fault remediableness using the signal SOFLAG2 output from the second scan path circuit. This offers an advantage of being able to reduce the load of the external test instrument, and to implement an easy and efficient fault decision operation such as deciding the presence or absence of a bit fault of the memory cells in the plurality of memory circuits, and the fault remediableness. Furthermore, incorporating the first scan path circuit and second scan path circuit in the semiconductor integrated circuit device including the plurality of memory circuits offers an advantage of being able to facilitate the design of the semiconductor integrated circuit device. This is because the scan path circuits can obviate the need for supplying the external tester with the fault information FLAG1 and FLAG2 by multiplexing them at the input/output ports of the semiconductor integrated circuit device for each RAM or memory circuit (for example, by providing a selector for switching the terminals).

Embodiment 3

Figure 3:
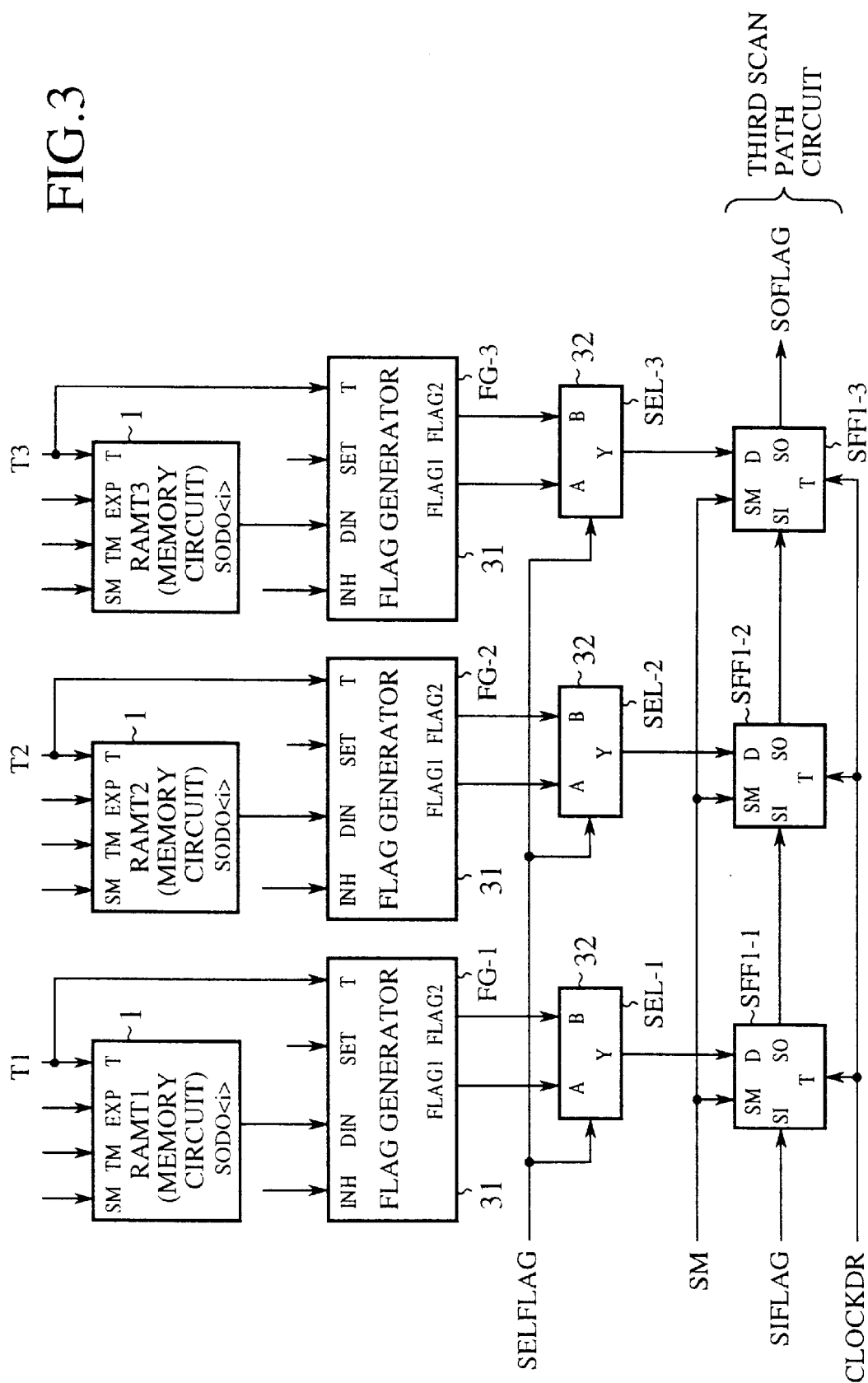
FIG. 3 is a circuit diagram showing an embodiment 3 of the semiconductor integrated circuit device in accordance with the present invention.

FIG. 3 is a circuit diagram showing an embodiment 3 of the semiconductor integrated circuit device in accordance with the present invention. In FIG. 3, RAMT1, RAMT2 and RAMT3 each designate a memory circuit 1 with a test circuit including a redundant circuit, which correspond to the RAMT1, RAMT2 and RAMT3 as shown in FIG. 2, respectively. Each reference numeral 31 designates a flag generator. The present embodiment 3 of the semiconductor integrated circuit device includes three flag generators FG-1, FG-2 and FG-3, which correspond to FG-1, FG-2 and FG-3, that is, the flag generators 2, as shown in FIG. 2.

Each reference numeral 32 designates a selector, and three selectors SEL-1, SEL-2 and SEL-3 are provided in the present embodiment. The selectors SEL-1, SEL-2 and SEL-3 are provided in a one-to-one correspondence with the flag generators FG-1, FG-2 and FG-3. The selectors SEL-1, SEL-2 and SEL-3 each select one of the signals FLAG1 and FLAG2 output from each of the plurality of memory circuits 1, RAMT1, RAMT2 and RAMT3, in response to the control signal SELFLAG, and output the signals selected.

Symbols SFF1-1, SFF1-2 and SFF1-3 each designate a scan flip-flop, which constitutes a third scan path circuit. The third scan path circuit, which corresponds to the first scan path circuit as shown in FIG. 2, loads the signals output from the selectors SEL-1, SEL-2 and SEL-3, that is, one of the signals FLAG1 and FLAG2 selected by each selector.

Next, the operation of the third embodiment will be described.

The foregoing embodiment 2 of the semiconductor integrated circuit device comprises the first scan path circuit and second scan path circuit, and makes a decision, from the values of the signals SOFLAG1 and SOFLAG2 supplied through the first scan path circuit and second scan path circuit, about the presence or absence of a bit fault of the memory cells in the memory circuit 1 and about the fault remediableness.

In contrast with this, the embodiment 3 of the semiconductor integrated circuit device comprises, instead of the first scan path circuit and second scan path circuit, only the third scan path circuit, and assigns the signals FLAG1 and FLAG2 from each of the memory circuits RAMT1, RAMT2 and RAMT3 as an A input and B input to each of the selectors 32, SEL-1, SEL-2 and SEL-3. Then, in response to the control signal SELFLAG supplied from an external test instrument like an LSI tester (not shown), for example, the selectors 32, SEL-1, SEL-2 and SEL-3, each select one of the signals FLAG1 and FLAG2, and supply the selected signals to the third scan path circuit. Thus, the external test instrument loads the signal SOFLAG output from the third scan path circuit, and decides the presence or absence of a fault and the fault remediableness of the memory circuit 1.

As described above, the embodiment 3 is configured such that it comprises the selectors 32, SEL-1, SEL-2 and SEL-3, in a one-to-one correspondence with the flag generators 31, FG-1, FG-2 and FG-3, respectively, switches the selectors 32 in response to the control signal SELFLAG, and outputs one of the signals FLAG1 and FLAG2 from the flag generators 31 through the third scan path circuit. Accordingly, in addition to the advantages of the foregoing embodiments 1 and 2 that can reduce the load of the external test instrument, the present embodiment 3 has an advantage of being able to further reduce the area of the semiconductor integrated circuit device, implement an easy and efficient fault decision operation such as deciding the presence or absence of a bit fault of the memory cells in the plurality of memory circuits and deciding the fault remediableness, and facilitate the design of the semiconductor integrated circuit device.

Embodiment 4

Figure 4:
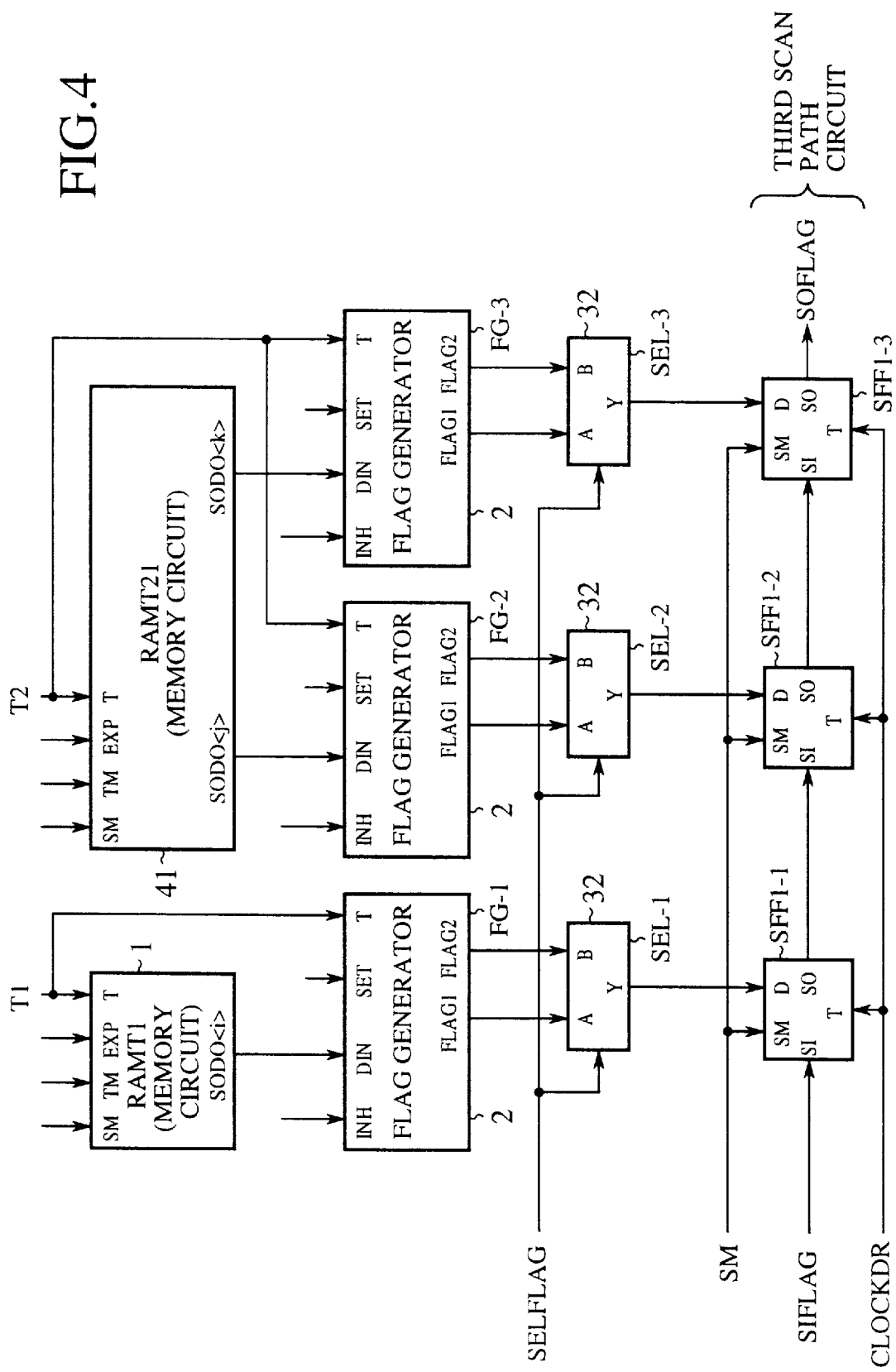
FIG. 4 is a circuit diagram showing an embodiment 4 of the semiconductor integrated circuit device in accordance with the present invention.

FIG. 4 is a circuit diagram showing an embodiment 4 of the semiconductor integrated circuit device in accordance with the present invention. In FIG. 4, RAMT1 designates a memory circuit with a test circuit including a 1-bit redundant circuit, which corresponds to the RAMT1 as shown in FIG. 1. The reference numeral 41 designates a memory circuit (RAMT21) with a test circuit including a 2-bit redundant circuit. The memory circuit 41 has two scan paths SODO<j> and SODO<k> corresponding to the 2-bit redundant circuit. Symbols FG-1, FG-2 and FG-3 each designate a flag generator 2, corresponding to the flag generators FG-1, FG-2 and FG-3 as shown in FIG. 2.

Symbols SEL-1, SEL-2 and SEL-3 designate selectors 32, which correspond to the flag generators FG-1, FG-2 and FG-3, respectively. The selector 32, SEL-1, SEL-2 and SEL-3, each select, in response to the control signal SELFLAG, one of the signals FLAG1 and FLAG2 output from the flag generators FG-1, FG-2 and FG-3 as in the foregoing embodiment 3 as shown in FIG. 3, and output the signals selected.

Symbols SFF1-1, SFF1-2 and SFF1-3 each designate a scan flip-flop, which constitutes a third scan path circuit. The third scan path circuit is the same as that Qf the embodiment 3 of the semiconductor integrated circuit device as shown in FIG. 3, which loads the signals selected by the selectors 32, SEL-1, SEL-2 and SEL-3, and outputs them.

Next, the operation of the present embodiment 4 will be described.

Figure 11:
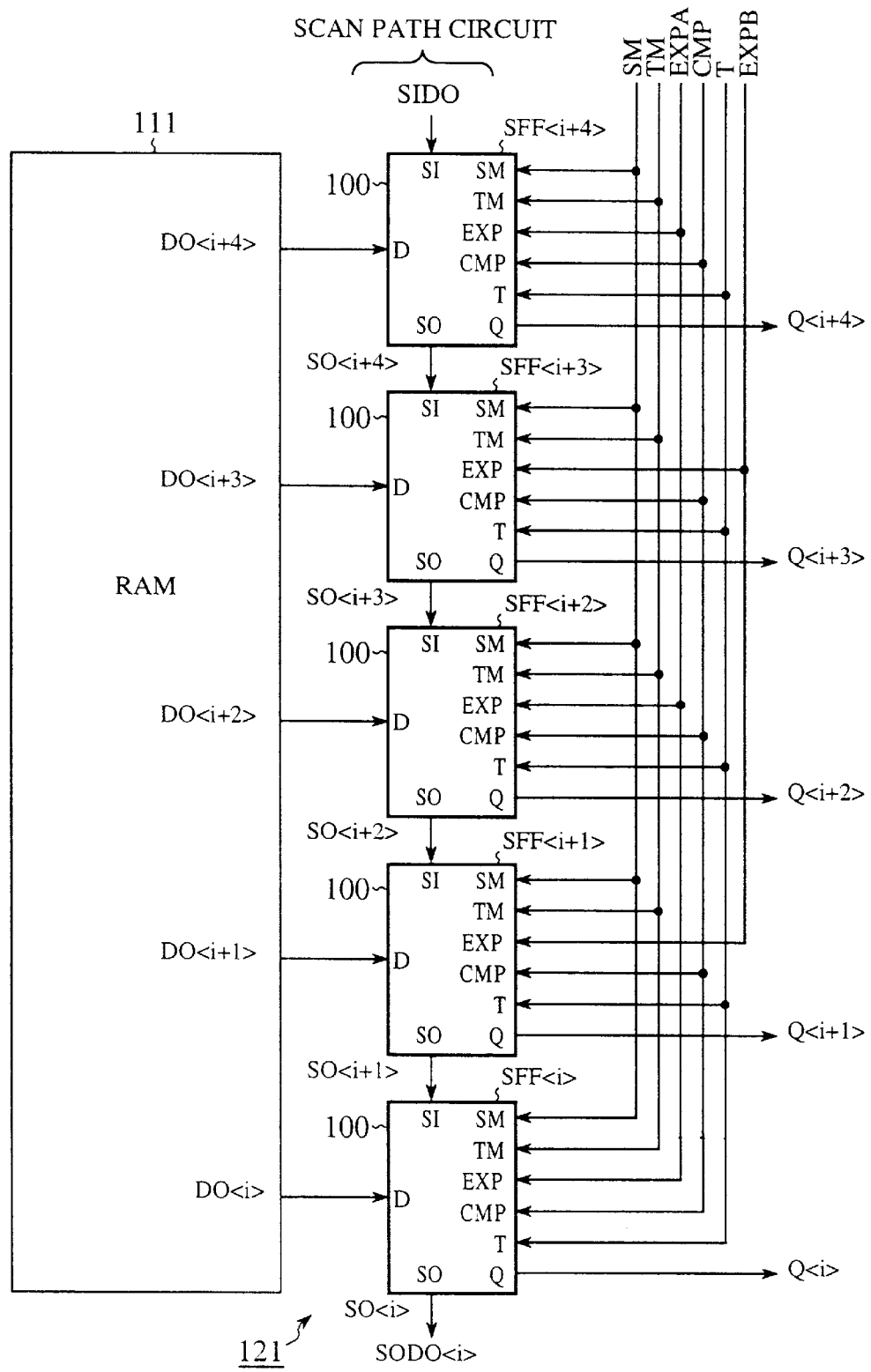
FIG. 11 is a circuit diagram showing a RAM with a test circuit in the conventional semiconductor integrated circuit device.

For example, a fault remediable RAM with 8-bit XDO<i>, which is configured using a RAM with 10-bit outputs DO<i>, can assume two scan paths with i=j=0 and i=k=5 in the conventional semiconductor integrated circuit device as shown in FIGS. 11 and 12.

The two scan paths have 5-bit length each, and the serial outputs SODO<0> and SODO<5> from each of the scan paths are supplied to the input terminals DIN of the flag generators 2, FG-2 and FG-3.

The presence or absence of a fault of bit outputs from DO<0> to DO<4> within the memory circuit RAMT21 can be decided by detecting the output FLAG1 of the flag generator FG-2. Likewise, the presence or absence of a fault of bit outputs from DO<5> to DO<9> within the memory circuit RAMT21 can be decided by detecting the output FLAG1 of the flag generator FG-3.

On the other hand, the fault remediableness of the bit outputs from DO<0> to DO<4> within the memory circuit RAMT21 can be decided by detecting the output FLAG2 of the flag generator FG-2. Likewise, the fault remediableness of the bit outputs from DO<5> to DO<9> within the memory circuit RAMT21 can be decided by detecting the output FLAG2 of the flag generator FG-3.

As described above, the present embodiment 4 is configured such that the memory circuit RAMT21 includes two scan path circuits and is connected to the two flag generators FG-2 and FG-3 and selectors SEL-2 and SEL-3, to decide the presence or absence of a fault and fault remediableness. This offers an advantage of being able to achieve an easy and efficient fault decision operation of the memory cells in the memory circuit, because an external test instrument like an LSI tester can decide the presence or absence of a fault and the fault remediableness from the signals FLAG1 and FLAG2, which reduces the load of the external test instrument.

Embodiment 5

Figure 5:
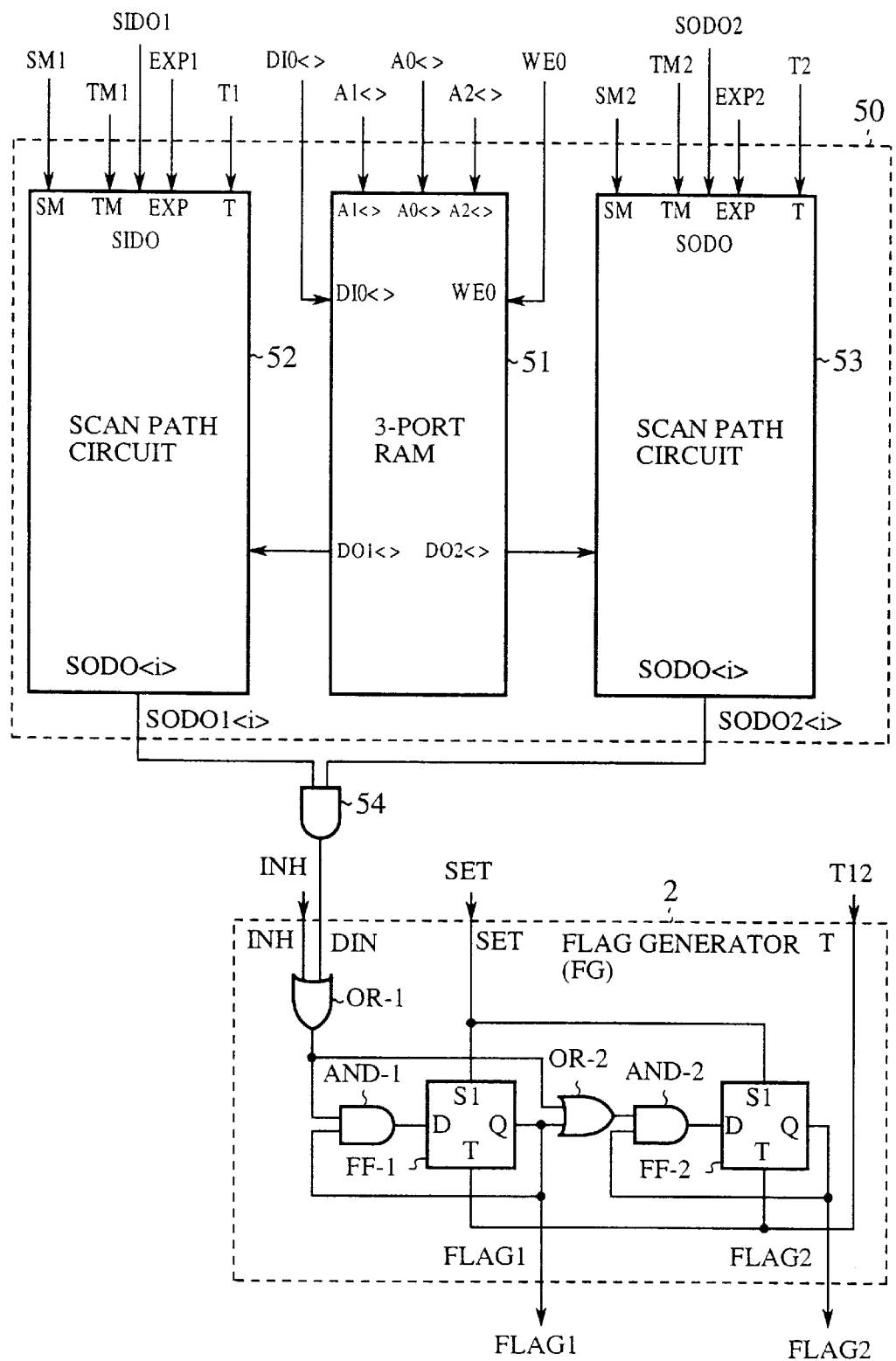
FIG. 5 is a circuit diagram showing an embodiment 5 of the semiconductor integrated circuit device in accordance with the present invention.

FIG. 5 is a circuit diagram showing an embodiment 5 of the semiconductor integrated circuit device in accordance with the present invention. In FIG. 5, the reference numeral 51 designates a 3-port RAM as a multi-port RAM, the two output ports of which supply their output signals DO1<> and D02<> to scan path circuits 52 and 53, respectively. Since the scan path circuit 52 and 53 each have the same configuration as the scan path circuit consisting of the scan flip-flops 100 as shown in FIG. 11, the description thereof is omitted here.

The reference numeral 54 designates an AND circuit for carrying out AND operation between the signals SODO1<i> and SODO2<i> which are output from the scan path circuits 52 and 53. The reference numeral 2 designates a flag generator FG, which is the same as that of the foregoing embodiment 1.

Figure 6:
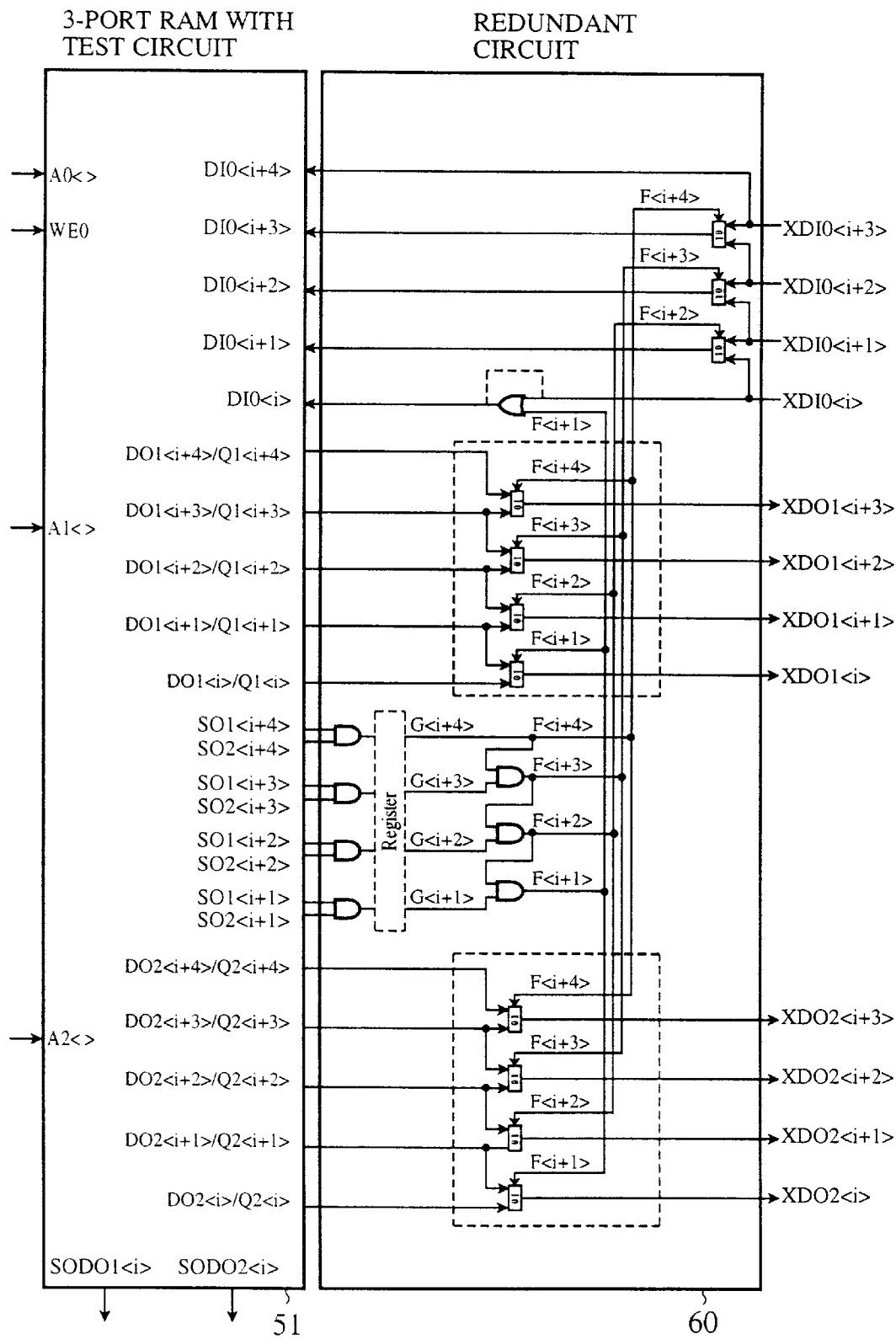
FIG. 6 is a circuit diagram showing connections between the semiconductor integrated circuit device as shown in FIG. 5 and a redundant circuit.

FIG. 6 is a circuit diagram showing a semiconductor integrated circuit device comprising a redundant circuit that is connected to the 3-port RAM 51 and the scan path circuits 52 and 53 as shown in FIG. 5. In FIG. 6, the reference numeral 60 designates the redundant circuit that is connected to the 3-port RAM 51 with a test circuit as shown in FIG. 5.

Next, the operation of the present embodiment 5 will be described.

The 3-port RAM 51 as shown in FIG. 5 outputs the signals DO1<> and D02<> from the two data output ports which are accessible independently. It writes data DIO<> in the address designated by the address signal A0 in response to the control signal WE0.

As for the address designated by the address signal A1<>, the 3-port RAM 51 supplies its corresponding output DO1<> to the scan path circuit 52. Likewise, as for the address designated by the address signal A2<>, the 3-port RAM 51 supplies its corresponding output D02<> to the scan path circuit 53.

In the semiconductor integrated circuit device associated with the redundant circuit 60, the address signals A0, A1<> and A2<> can designate different addresses. As for the 3-port RAM 51 as shown in FIG. 5, the two scan path circuits 52 and 53 are connected to the output data DO1<> and D02<> which are produced through the two output data ports.

The output signals from the scan path circuits 52 and 53, that is, the output signals SODO1<i> and SODO2<i> corresponding to the signal SODO<i> from the scan flip-flop 100 as shown in FIG. 11, are ANDed by the AND circuit 54. The AND result is supplied to the flag generator (FG) 2 as an input signal DIN. The flag generator (FG) 2 operates in the same manner as that of the foregoing embodiment 1.

Thus, in the present embodiment 5 of the semiconductor integrated circuit device, the 3-port RAM 51 with a test circuit incorporating the redundant circuit 60 shifts out the compared results from the two data output ports at the same time, and the flag generator (FG) 2 detects the presence or absence of a fault of a bit fault in the memory cells, as well as its fault remediableness.

Accordingly, if the output values DOp<m>(p=1 or 2) produced from one of the output ports of the 3-port RAM 51 includes a fault, a decision can be made through the AND circuit 54 that a fault takes place in the data sequence with the bit number m in the 3-port RAM 51. Thus, a switching processing is carried out in the redundant circuit 60. Besides, the presence or absence of a fault is decided using the signal FLAG1 output from the flag generator (FG) 2. Likewise, the fault remediableness can be decided using the signal FLAG2 output from the flag generator (FG) 2 in the same manner as that of the foregoing embodiments 1–4.

Thus, the present embodiment 5 comprises the scan path circuits 52 and 53 which correspond to the output ports DO1<> and D02<> of the 3-port RAM 51 as a multi-port RAM, and function as a test circuit; the AND circuit 54 for ANDing the outputs from the test circuits; and the flag generator (FG) 2. This enables an external test instrument like an LSI tester, even with respect to the semiconductor integrated circuit device incorporating the multi-port RAM, to decide the presence or absence of a fault and the fault remediableness as in the foregoing embodiment 1 by loading the signals FLAG1 and FLAG2 output from the flag generator (FG) 2, for example. This offers an advantage of being able to reduce the load of the external test instrument, and to make an easy and efficient fault decision operation such as the presence or absence of a fault and the fault remediableness of the memory cells in the multi-port RAM functioning as the memory circuit.

Embodiment 6

Figure 7C:
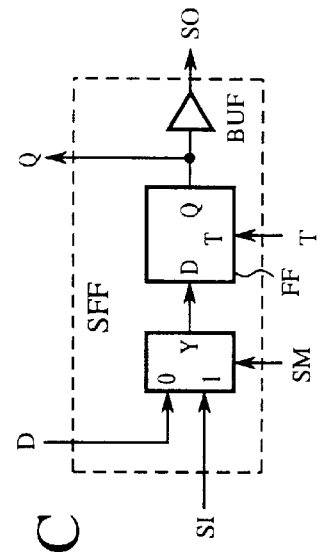
FIGS. 7A–7C are circuit diagrams showing an embodiment 6 of the semiconductor integrated circuit device in accordance with the present invention.
Figure 7A:
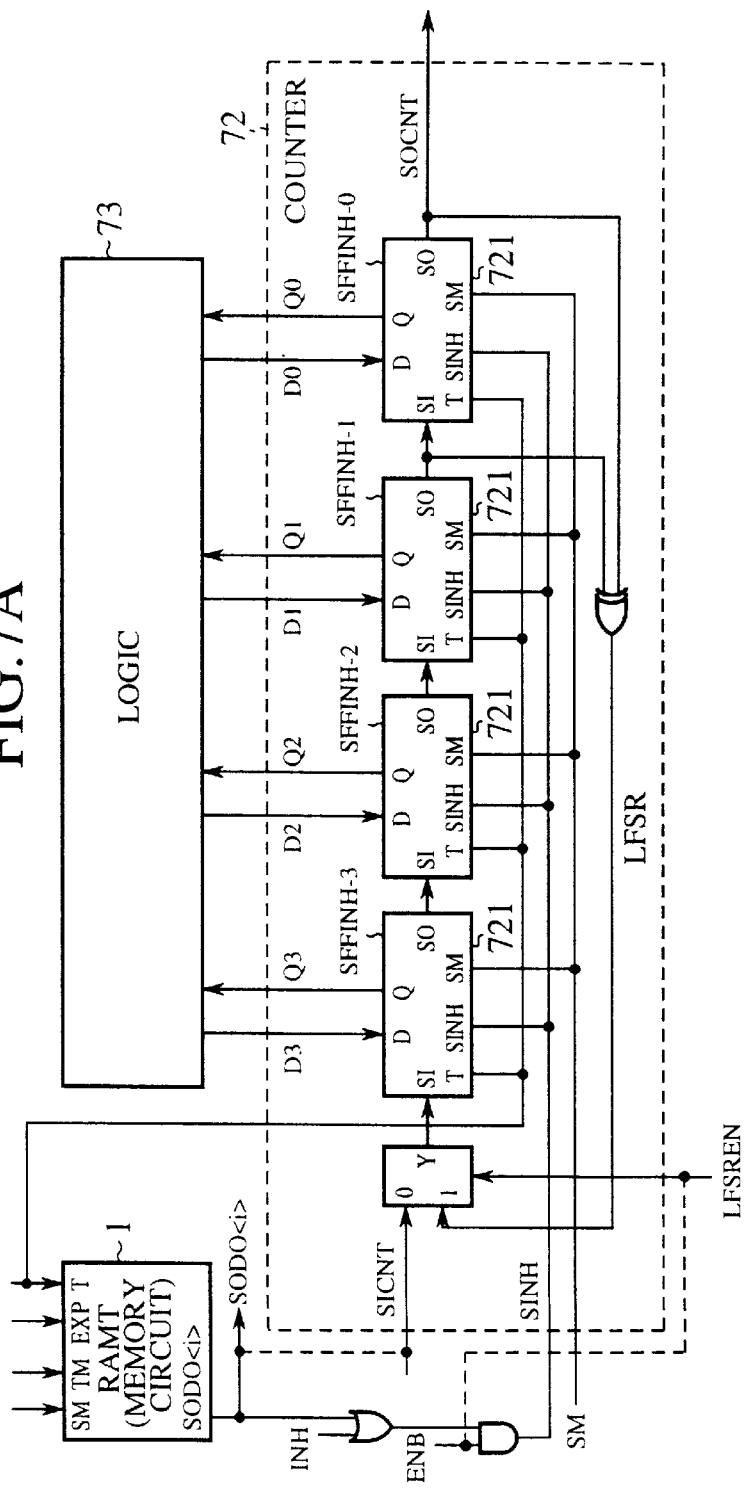
Figure 7B:
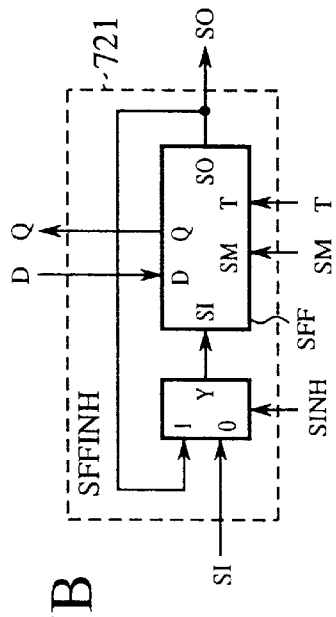

FIGS. 7A–7C are circuit diagrams showing an embodiment 6 of the semiconductor integrated circuit device in accordance with the present invention. In FIG. 7A, the reference numeral 1 designates a memory circuit with a test circuit including a redundant circuit, that is, a RAM that corresponds to the memory circuit 1 as shown in FIG. 1. The reference numeral 72 designates a counter circuit, consisting of a Linear Feedback Shift Register (LFSR), for example. Although a 4-bit LFSR is shown in FIG. 7A, this is not essential in the present invention. For example, a binary counter can be employed as the counter circuit. The counter circuit 72 counts the value "0" of the fault information, which is the test result output from the memory circuit 1. Thus, it can count the number of bits of a fault even for the case where three or more errors are remediable.

In the example as shown in FIG. 7A, the counter circuit (LFSR) 72 is configured from four flip-flops 721 connected in series. The reference numeral 73 designates a logic circuit (LOGIC) which is connected to the flip-flops 721 in the counter circuit (LFSR) 72 to perform predetermined operations.

FIGS. 7B and 7C are circuit diagrams showing an internal structure of the flip-flop 721 constituting the counter circuit (LFSR) 72.

Next, the operation of the present embodiment 6 will be described.

In the normal operation mode, the control signal SM takes a value "0", so that the flip-flops 721 in the counter circuit (LFSR) 72 are connected to the logic circuit (LOGIC) 73, and the semiconductor integrated circuit device implements the desired operation. When the control signal SM takes a value "1", the memory circuit 1 enters the test operation mode, and the counter circuit (LFSR) 72 counts the number of pieces of the fault information in the following sequence.

First, an enable signal ENB is set at "0", so that a control signal SINH and control signal LFSREN are placed at "0". In this state, the counter circuit (LFSR) 72 shifts in its initial value (for example, all "1") from the control signal SICNT.

Subsequently, the enable signal ENB is set at "1", the LFSREN is set at "1" and the INH is set at "0", so that the control signal SINH is placed at SINH =SODO<i>. Thus, the counter circuit (LFSR) 72 counts the number of "0"s in the signal SODO<i> that is shifted in.

The value "0" indicates the fault information fed from the memory circuit (RAMT) 1. In other words, the counter circuit (LFSR) 72 carries out its shift operation only when the signal SODO<i> is "0".

Finally, the enable signal ENB is set at "0", so that the control signal SINH is placed at "0". Thus, the counter circuit (LFSR) 72 shifts out its count value to the outside as a signal SOCNT.

Therefore, an external test instrument like an LSI tester, observing the signal SOCNT output from the counter circuit (LFSR) 72, can decide the presence or absence of a fault and the fault remediableness in the memory circuit RAMT1.

Incidentally, the signal SICNT can be connected to the signal SODO<i> output from the memory circuit (RAMT) 1, and the signal LFSREN can be connected to the enable signal ENB. In addition, the counter circuit (LFSR) 72 can increase its number of bits, that is, the number of flip-flops 721 as needed. For example, when the memory circuit (RAMT) 1 scans out 8-bit fault information as the signal SODO<i>, an eight or more bit LFSR is to be used. Furthermore, a combination can be used of the semiconductor integrated circuit device as shown in FIGS. 7A–7C and the semiconductor integrated circuit device as shown in FIG. 1. In this case, the combination has such a configuration that the flag generator (FG) 2 and the counter circuit 72 are provided for the single memory circuit (RAMT) 1. Since the flag generator (FG) 2 operates as in the embodiment 1, in this case, the description thereof is omitted here.

As described above, the present embodiment 6 comprises the counter circuit 72 in the semiconductor integrated circuit device, which makes it possible to count the number of fault bits even if faults take place in three or more memory cells in the memory circuit RAMT1. This offers an advantage of being able to reduce the load of the external test instrument like an LSI tester, and to make a decision of a fault in a semiconductor fabrication line. Furthermore, the combination of the counter circuit 72 and the flag generator (FG) 2 as shown in the embodiment 1 which are provided for the memory circuit (RAMT) 1, offers an advantage, besides the foregoing advantage, of being able to make the fault decision operation, which decides the presence or absence of a fault of the memory cells and the fault remediableness by the redundant circuit, more easily and efficiently.

Embodiment 7

Figure 8:
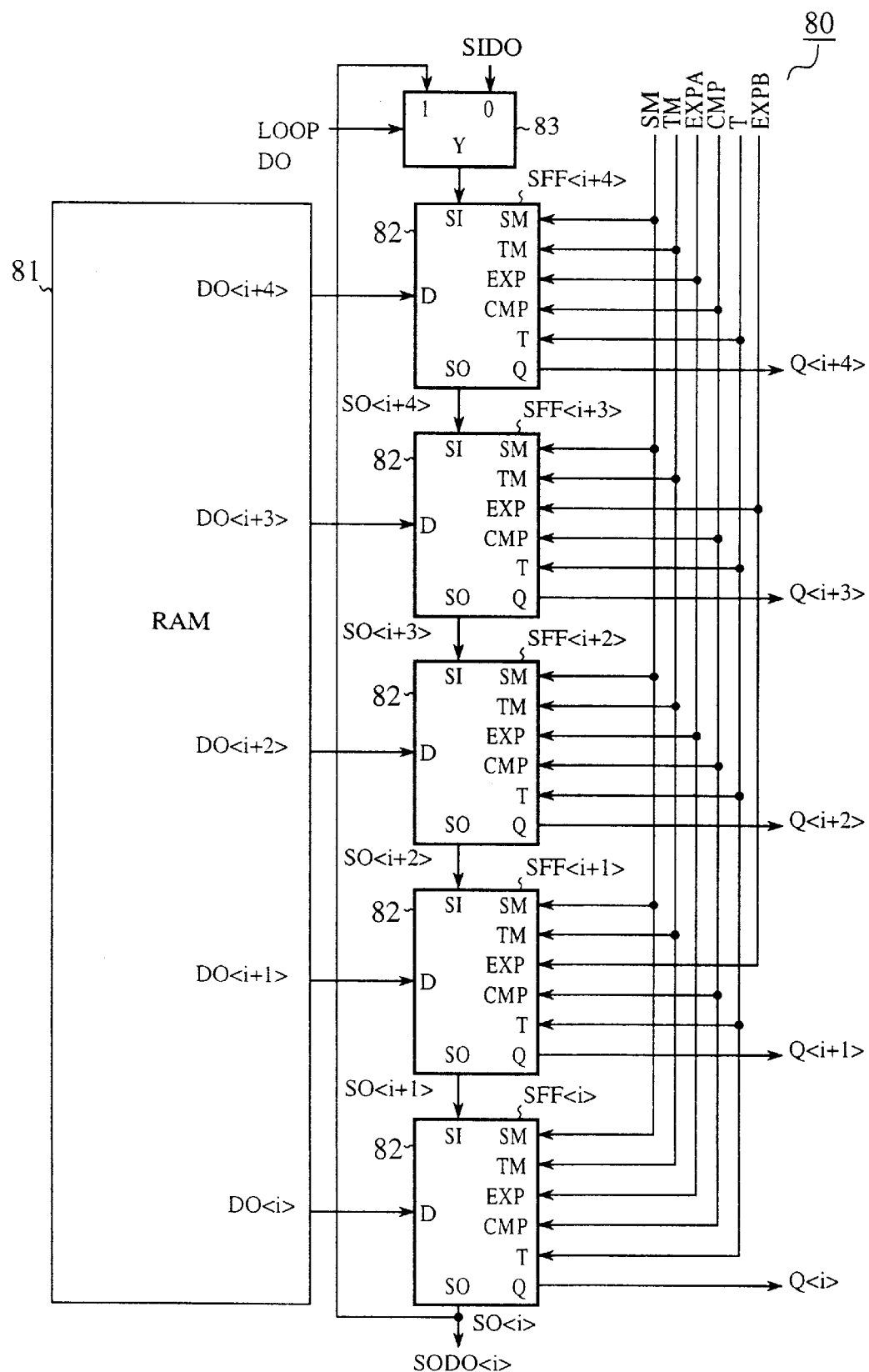
FIG. 8 is a circuit diagram showing an embodiment 7 of the semiconductor integrated circuit device in accordance with the present invention.
Figure 10:
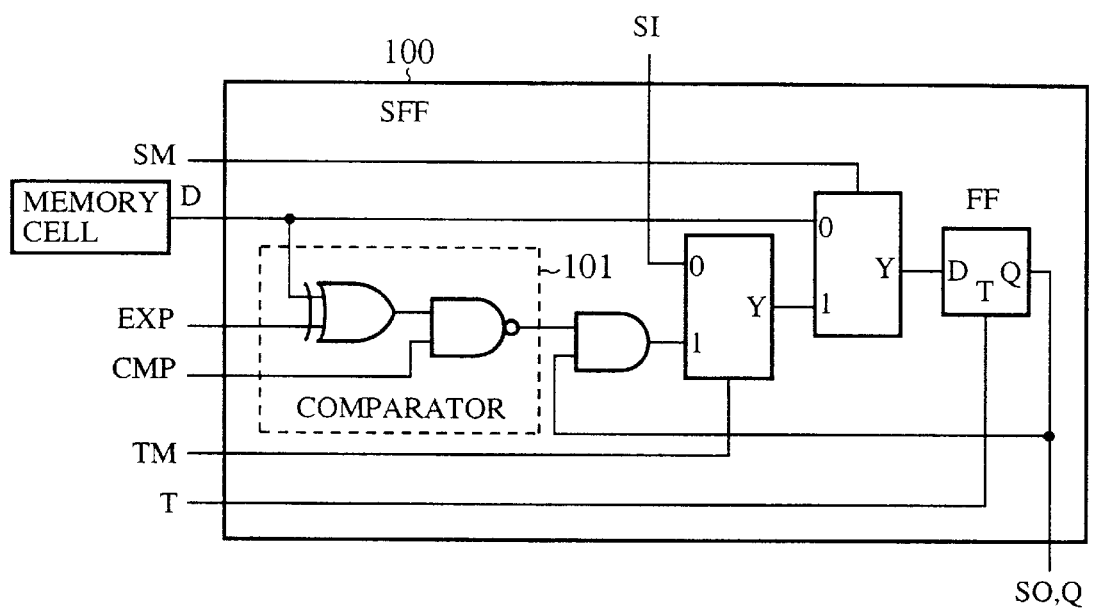
FIG. 10 is a circuit diagram showing a scan flip-flop for a RAM test in a conventional semiconductor integrated circuit device.

FIG. 8 is a circuit diagram showing an embodiment 7 of the semiconductor integrated circuit device in accordance with the present invention. In FIG. 8, the reference numeral 81 designates a RAM consisting of memory cells, which corresponds to the RAM 111 as shown in FIG. 11. Reference numerals 82 designate five scan flip-flops connected in series, constituting a scan path circuit. The scan flip-flops 82 constituting the scan path circuit is a test circuit that loads the data DO<> output from the RAM 81, compares the data with a set of preset expected values, scans compared results, and outputs them to the outside as fault information SODO<i>. The scan flip-flops 82 constituting the test circuit correspond to the scan flip-flops 100 as shown in FIGS. 10 and 11.

The reference numeral 83 designates a selector for circulating in the scan path circuit the fault information SODO<i> that is output from the final scan flip-flop 82 of the scan path circuit in response to the control signal LOOPDO. The reference numeral 80 designates a memory circuit with a test circuit as a semiconductor integrated circuit device comprising the RAM 81, scan flip-flops (scan path circuit) 82, and selector 83.

Figure 9:
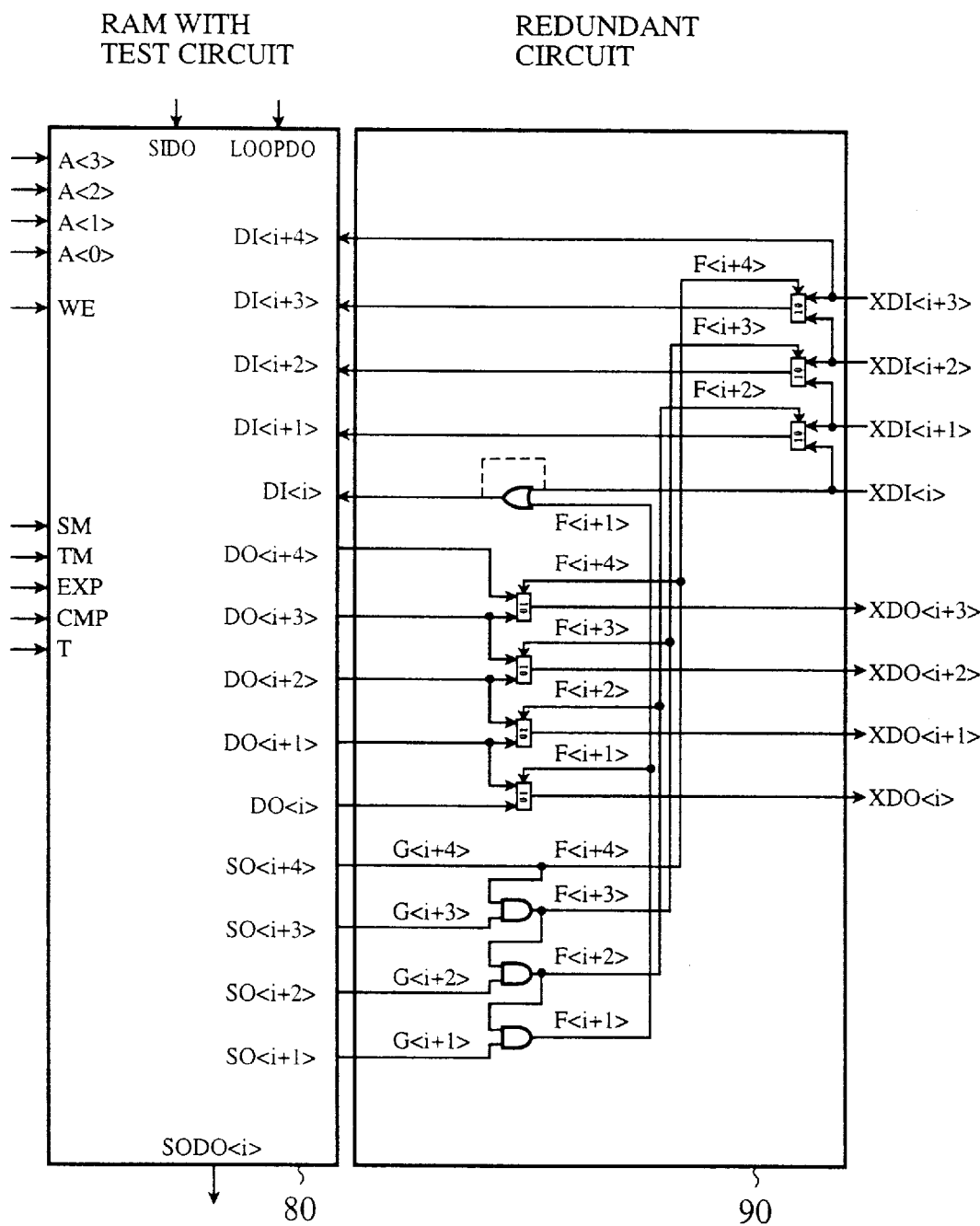
FIG. 9 is a circuit diagram showing connections between the semiconductor integrated circuit device as shown in FIG. 8 and a redundant circuit.

FIG. 9 is a circuit diagram showing a semiconductor integrated circuit device including a redundant circuit in addition to the semiconductor integrated circuit device as shown in FIG. 8. In FIG. 9, the reference numeral 80 designates the memory circuit with a test circuit as shown in FIG. 8, and 90 designates a redundant circuit. The redundant circuit 90 has the same structure as the redundant circuit 122 as shown in FIG. 12.

Next, the operation of the embodiment 7 will be described.

As described above, in the foregoing embodiments 1–6 of the semiconductor integrated circuit device in accordance with the present invention, the fault information in the scan path circuit is lost when it is scanned out to the outside in order to make a decision of the presence or absence of a fault in the plurality of memory cells constituting the RAM, and a decision of the fault remediableness by the redundant circuit. Therefore, to switch to the redundant circuit to remedy the fault memory cells, it is necessary to retest or to hold the fault information by transferring it to a register added for that purpose.

In contrast with this, the present embodiment 7 of the semiconductor integrated circuit device is configured such that it incorporates the selector 83 in the memory circuit 80 to circulate the fault information in response to the control signal LOOPDO, thereby holding the fault information in the five scan flip-flops 82 which are connected in series to constitute the scan path circuit.

For example, placing the control signal LOOPDO at "1" and carrying out a 5-bit shift operation in the scan flip-flop 82 will return the fault information SODO<i> in its original position, that is, into the scan flip-flops 82.

Receiving the fault information SODO<i> during the shift operation, an external test instrument like an LSI tester (not shown) counts the fault information and decides the presence or absence of a fault and the fault remediableness. After the 5-bit shift operation, the fault information SODO<i> returns to its original position, that is, into the scan flip-flops 82 to be held. Thus, the subsequent switching operation to the redundant circuit 90 can utilize the fault information held in the ear scan flip-flops 82 from the redundant circuit 90 side through the signal SO<> as shown in FIG. 9. This makes it possible to obtain the fault information without carrying out a retest, thereby achieving the redundant switching processing efficiently.

Thus, the present embodiment 7 incorporates the selector 83 in the memory circuit 80 to hold the fault information by circulating it through the five scan flip-flops 82, which are connected in series to constitute the scan path circuit, in response to the control signal LOOPDO. This offers an advantage of being able to implement the fault remedy by the redundant circuit 90 even after the semiconductor integrated circuit device is incorporated into a product like a computer. Specifically, it offers an advantage of being able to achieve the redundant switching processing efficiently by obviating the necessity for carrying out a test operation after incorporating the semiconductor integrated circuit device into a product because the device makes a decision of the fault remediableness by a single test operation, and holds the decision result in the scan path circuit through the selector 83.

What is claimed is:

1. A semiconductor integrated circuit device comprising:
    at least one memory circuit that includes a plurality of memory cells for storing data, a redundant circuit provided for said plurality of memory cells, and a scan path circuit for comparing output data of said plurality of memory cells with a set of predetermined expected values and for outputting compared result information by serially shifting out compared results; and
    at least one first detector for loading the compared result information serially output from said scan path circuit of said memory circuit, for detecting whether at least one piece of mismatch information is included in the compared result information, and for outputting a detection result.

2. The semiconductor integrated circuit device according to claim 1, further comprising at least one second detector for loading the compared result information serially output from said scan path circuit, for detecting whether at least two pieces of mismatch information is present in the compared result information, and for outputting a detection result.

3. The semiconductor integrated circuit device according to claim 2, wherein said at least one memory circuit includes a plurality of memory circuits, said at least one first detector includes a plurality of first detectors, and said at least one second detector includes a plurality of second detectors, and wherein said semiconductor integrated circuit device further comprises a first scan path circuit for loading outputs of said plurality of first detectors and for shifting them out, and a second scan path circuit for loading outputs of said plurality of second detectors and for shifting them out.

4. The semiconductor integrated circuit device according to claim 2, wherein said at least one memory circuit includes a plurality of memory circuits, said at least one first detector includes a plurality of first detectors, and said at least one second detector includes a plurality of second detectors, and wherein said semiconductor integrated circuit device further comprises:
    a plurality of selectors, provided for said plurality of first detectors and said plurality of second detectors, for selecting one of a set of the outputs of said plurality of first detectors and a set of the outputs of said plurality of second detectors and for outputting the set selected; and
    a third scan path circuit for loading the set selected by said plurality of selectors, and for serially shifting it out.

5. The semiconductor integrated circuit device according to claim 1, wherein said at least one memory circuit is a mutliport memory circuit that has n data output ports that are accessible independently, where n is an integer greater than one, said redundant circuit is provided for the mutliport memory cells in said mutliport memory circuit, and said scan path circuit is provided for each of k data output ports of the n data output ports, where k is an integer greater than one and less than or equal to n, and i-th scan path circuit compares output data from i-th data output port with i-th set of predetermined expected values and serially shifts out a plurality of compared results, where i is an integer from one to k,
    wherein said semiconductor integrated circuit device further comprising an AND circuit for ANDing the serial outputs from said scan path circuits, and
    wherein said at least one first detector detects whether the output of said AND circuit includes at least one piece of mismatch information, and outputs a detection result.

6. The semiconductor integrated circuit device according to claim 5, further comprising a second detector for detecting whether at least two pieces of mismatch information is present in the output of said AND circuit, and for outputting a detection result.

7. A semiconductor integrated circuit device comprising:
    a memory circuit that includes a plurality of memory cells for storing data, a redundant circuit provided for said plurality of memory cells, and a scan path circuit for comparing output data of said plurality of memory cells with a set of predetermined expected values and for outputting compared result information by serially shifting out compared results; and
    a counter circuit for loading the compared result information serially output from said scan path circuit, and for counting a number of pieces of mismatch information in the compared result information.

8. A semiconductor integrated circuit device comprising a memory circuit including:
    a plurality of memory cells for storing data;
    a redundant circuit provided for said plurality of memory cells;
    a scan path circuit for comparing output data of said plurality of memory cells with a set of predetermined expected values and for outputting compared result information by serially shifting out compared results; and
    a serial input selector for supplying said scan path circuit with the compared result information serially output from said scan path circuit.

* * * * *